United States Patent
Choi et al.

(10) Patent No.: US 6,964,839 B1
(45) Date of Patent: Nov. 15, 2005

(54) PHOTOSENSITIVE POLYMER HAVING CYCLIC BACKBONE AND RESIST COMPOSITION CONTAINING THE SAME

(75) Inventors: Sang-jun Choi, Seoul (KR); Hyun-woo Kim, Seongnam (KR); Sang-gyun Woo, Suwon (KR); Joo-tae Moon, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 09/715,041

(22) Filed: Nov. 20, 2000

(30) Foreign Application Priority Data

Nov. 23, 1999 (KR) ............................... 1999-52225

(51) Int. Cl.$^7$ ............................................. G03F 7/039
(52) U.S. Cl. ................... 430/270.1; 430/326; 430/905; 430/910; 525/337
(58) Field of Search ............................ 430/270.1, 326, 430/905, 910; 525/337

(56) References Cited

U.S. PATENT DOCUMENTS

| | | | |
|---|---|---|---|
| 4,986,648 A * | 1/1991 | Kobayashi et al. ..... | 351/160 R |
| 5,405,720 A * | 4/1995 | Hosaka et al. .............. | 430/191 |
| 5,616,667 A | 4/1997 | Sezi et al. | |
| 5,703,186 A | 12/1997 | Sezi et al. | |
| 5,738,975 A * | 4/1998 | Nakano et al. ........... | 430/280.1 |
| 6,103,450 A * | 8/2000 | Choi ........................ | 430/270.1 |
| 6,103,845 A * | 8/2000 | Choi et al. .................. | 526/271 |
| 6,110,637 A | 8/2000 | Sezi et al. | |
| 6,114,084 A * | 9/2000 | Kang et al. ............... | 430/270.1 |
| 6,171,754 B1 * | 1/2001 | Choi et al. ............... | 430/270.1 |
| 6,239,231 B1 * | 5/2001 | Fujishima et al. ........ | 525/337 |
| 6,242,153 B1 * | 6/2001 | Sato et al. ............... | 430/270.1 |
| 6,277,538 B1 * | 8/2001 | Choi et al. ............... | 430/270.1 |
| 6,280,897 B1 * | 8/2001 | Asakawa et al. ......... | 430/270.1 |
| 6,280,903 B1 * | 8/2001 | Kang et al. ............... | 430/270.1 |
| 6,284,429 B1 * | 9/2001 | Kinsho et al. ............ | 430/270.1 |
| 6,300,036 B1 * | 10/2001 | Choi et al. ............... | 430/270.1 |
| 6,312,867 B1 * | 11/2001 | Kinsho et al. ........... | 430/270.1 |
| 2001/0014428 A1 * | 8/2001 | Uetani et al. ............ | 430/270.1 |
| 2001/0024763 A1 * | 9/2001 | Choi et al. ................ | 430/270.1 |
| 2001/0044071 A1 * | 11/2001 | Hasegawa et al. ....... | 430/270.1 |

FOREIGN PATENT DOCUMENTS

| | | | | |
|---|---|---|---|---|
| GB | 2357775 A | * | 7/2001 | ......... C08F 220/10 |
| JP | 5-9231 | | 1/1993 | |
| JP | 5-11450 | | 1/1993 | |
| JP | 10-153864 | | 6/1998 | |

OTHER PUBLICATIONS

Definition of copolymer The American Heritage Dictionary of the English Language, Third Edition copyright 1992 by Houghton Mifflin Company.*
R.D. Allen et al., "Cyclic Olefin Resist Polymers and Polymerizations for Improved Etch Resistance," Journal of Photopolymer Science and Technology, vol. 12, No. 3 (1999), pp. 501-507.
Koji Nozaki et al., "A Novel Polymer for a 193-nm Resist," Journal of Photopolymer Science and Technology, vol. 9, No. 3 (1996), pp. 509-522.
Robert D. Allen et al., "Single Layer Resists With enhanced Etch Resistance for 193 nm Lithography," Journal of Photopolymer Science and Technology, vol. 7, No. 3 (1994), pp. 507-516.

* cited by examiner

Primary Examiner—Yvette C. Thornton
(74) Attorney, Agent, or Firm—Volentine Francos & Whitt, PLLC

(57) ABSTRACT

A photosensitive copolymer has a weight-average molecular weight of 3,000 to 100,000 and is represented by the following formula:

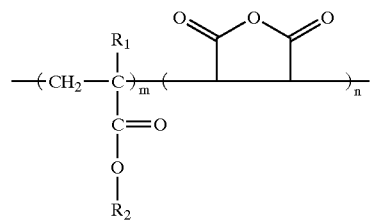

wherein $R_1$ is a hydrogen atom or methyl, $R_2$ is an acid-labile tertiary alkyl group, and $m/(m+n)$ is 0.5 to 0.8.

16 Claims, No Drawings

PHOTOSENSITIVE POLYMER HAVING CYCLIC BACKBONE AND RESIST COMPOSITION CONTAINING THE SAME

BACKGROUND OF THE INVENTION

1. Field of the Invention

The present invention relates to a chemically amplified resist composition, and more particularly, to a photosensitive polymer having a cyclic backbone, and to a resist composition for an ArF excimer laser obtained therefrom.

2. Description of the Related Art

As semiconductor devices become highly integrated, fine pattern formation is required from photolithography processes used in the fabrication of such devices. Further, as the capacities of semiconductor devices increase beyond 1 giga bit, a pattern size having a design rule of less than 0.2 μm becomes necessary. This places limitations on the use of conventional resist materials adapted for the KrF excimer laser (wavelength: 248 nm). Thus, to permit a lower wavelength operation, new resist materials capable of being developed using an ArF excimer laser (wavelength: 193 nm) have been developed for use in lithography processes.

Present resist materials that are commercially used in lithography processes employing the ArF excimer laser suffer certain drawbacks when compared with more conventional resist materials. The most common problems relate to transmittance of the polymer and resistance to dry etching.

As widely known ArF resist materials, (meth)acrylate polymers are generally used. In particular, the most common resist material is poly(methyl methacrylate-tert-butyl methacrylate-methacrylic acid) terpolymer system manufactured by IBM, Inc. However, such polymers have very weak resistance to dry etching.

Accordingly, to increase the resistance to dry etching, a polymer having a backbone composed of an alicyclic compound such as an isobornyl group, an adamantyl group or a tricyclodecanyl group, is used. However, the resulting resist still exhibits weak resistance to dry etching.

Also, since the alicyclic compound is hydrophobic, in the case where the alicyclic compound is contained in the terpolymer, the adhesion to underlying layers is deteriorated.

In an attempt to overcome the above-described problem, a tetrapolymer represented by the following formula in which a carboxylic acid group is introduced to the backbone of the polymer has been proposed (see *J. Photopolym. Sci. Technol.*, 7(3), 507 (1994).).

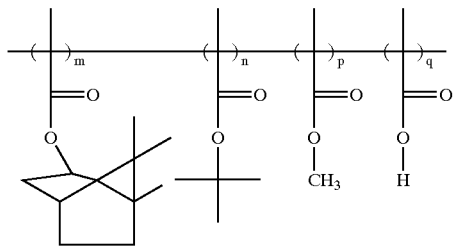

However, the resist layer obtained from the polymer having the above structure still has poor adhesion to underlying layers, and resistance to dry etching is poor. Also, a developing solution that is generally usable for development must be diluted before being used.

Alternatively, a methacrylate copolymer having an alicyclic protecting group represented by the following formula has been proposed (see *J. Photopolym. Sci. Technol.*, 9(3), 509 (1996).).

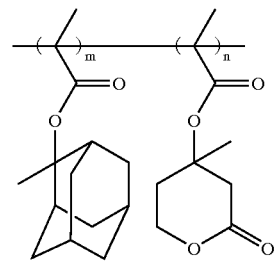

The resist layer obtained from the polymer having the above structure still has poor resistance to dry etching. Also, severe line edge roughness is observed when a line pattern is formed from the resist layer. Also, the manufacturing cost for raw materials for preparing the copolymer is very high. In particular, in order to improve an adhesion characteristic, a monomer having a lactone group is introduced thereto. However, the monomer generally to costly for practical use. Thus, it is desirable to introduce a new monomer with which an expensive monomer can be replaced to facilitate commercial use as a resist material.

As another conventional polymer, a cycloolefine-maleic anhydride (COMA) alternating polymer represented by the following formula has been proposed (see *J. Photopolym. Sci. Technol.*, 12(3), 501 (1999).).

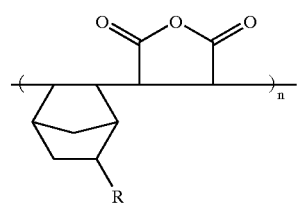

The resist layer obtained from the polymer having the above structure is poor in terms of resolution, transmission, adhesion characteristic and yield. Also, due to the structural characteristic of the backbone, the resist layer has a high glass transition temperature of about 200° C. or higher. Thus, several problems may be encountered in processes using the resist layer.

SUMMARY OF THE INVENTION

To solve the above problems, it is a feature of the present invention to provide a photosensitive polymer which is relatively inexpensive to fabricate and which has sufficiently increased resistance to dry etching while exhibiting an improved adhesion characteristic to underlying layers.

It is another feature of the present invention to provide a resist composition which provides for improved lithographic performance in a lithography process using an ArF excimer laser.

Accordingly, to achieve the above features, there is provided a photosensitive copolymer having a weight-average molecular weight of 3,000 to 100,000 and represented by the following formula:

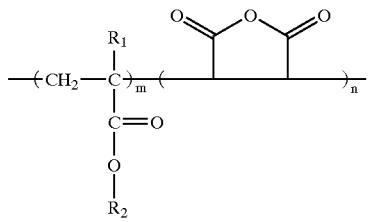

wherein $R_1$ is a hydrogen atom or methyl, $R_2$ is an acid-labile tertiary alkyl group, and $m/(m+n)$ is 0.5 to 0.8.

Preferably, the photosensitive copolymer has a weight-average molecular weight of 5,000 to 30,000.

Also, $R_2$ is preferably an alicyclic hydrocarbon group, and more preferably $R_2$ is 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, or 2-ethyl-2-adamantyl.

According to another aspect of the present invention, there is provided a resist composition including the photosensitive copolymer and a photoacid generator (PAG).

The PAG is preferably contained in an amount of 1.0 to 15% by weight based on the total weight of the copolymer.

Preferably, the PAG is selected from the group consisting of triarylsulfonium salts, diaryliodonium salts, sulfonates or mixtures thereof. More preferably, the PAG is triphenylsulfonium triflate, diphenyliodonium triflate, triphenylsulfonium nonaflate, diphenyliodonium nonaflate, triphenylsulfonium antimonate, diphenyliodonium antimonate, di-t-butyl diphenyliodonium triflate, N-succinimidyl triflate, 2,6-dinitrobenzyl sulfonate, or a mixture thereof.

The resist composition may further include an organic base. Preferably, the organic base is contained in an amount of 0.01 to 2.0% by weight based on the total weight of the copolymer.

The organic base is preferably triethylamine, triisobutylamine, trioctylamine, diethanolamine, triethanolamine or a mixture thereof.

Also, the resist composition may further include a surfactant.

The surfactant is preferably contained in an amount of 50 to 500 ppm.

Preferably, the surfactant is polyether or polysulfonate, and more preferably, the surfactant is poly(ethylene glycol).

According to the present invention, a resist composition which consists of a photosensitive copolymer having a considerably reduced manufacturing cost, and which has improved adhesion to underlying layers and sufficiently increased resistance to dry etching, can be attained. Also, since the photosensitive polymer has an appropriate glass transition temperature, the resist composition obtained from the polymer exhibits improved lithographical performance when it is applied to a photolithography process.

DESCRIPTION OF THE PREFERRED EMBODIMENTS

A photosensitive polymer according to an embodiment of the present invention is represented by the following formula (1):

[Formula (1)]

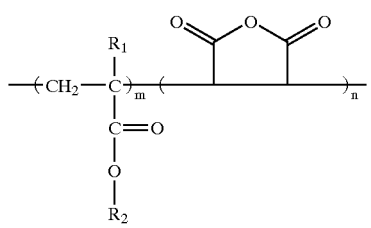

wherein $R_1$ is a hydrogen atom or methyl, $R_2$ is an acid-labile group using acid generated during exposure, in particular, a saturated or unsaturated alicyclic hydrocarbon of a tert-alkyl type. Examples of $R_2$ are bulky tertiary alkyl groups having a saturated alicyclic hydrocarbon ring, such as 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, and 2-ethyl-2-adamantyl.

The photosensitive polymer is a copolymer including maleic anhydride or a (meth)acrylate monomer, and the composition ratio of the respective monomers can be adjusted so as to attain a polymer having desired characteristics such as excellent adhesion and wettability. In other words, in the above formula, m and n are adjustable according to the ratio of the respective monomers mixed. Preferably, $m/(m+n)$ equals 0.5 to 0.8.

Also, in order to prepare a polymer having desired properties, another (meth)acrylate monomer may be further added to form a terpolymer.

The photosensitive polymer is a copolymer including maleic anhydride and a (meth)acrylate monomer having a bulky alicyclic protecting group. The photosensitive polymer may employ a maleic anhydride monomer, instead of a lactone monomer, which is expensive, thereby greatly reducing the manufacturing cost and mitigating problems encountered by the conventional (meth)acrylate polymer. Thus, the resist composition obtained from the photosensitive polymer has excellent adhesion to underlying layers and excellent resistance to dry etching. Also, compared to the conventional COMA copolymer, the transmittance is noticeably enhanced and the yield is increased.

Also, the photosensitive polymer according to the present invention has an appropriate glass transition temperature in the range of 140 to 180° C. Thus, the resist layer prepared using the photosensitive polymer according to the present invention has a sufficiently high annealing effect during baking, thereby reducing the free volume thereof. Therefore, the stability against the ambient atmosphere of the resist layer can be improved even with post-exposure delay (PED), thereby improving the lithographic performance.

EXAMPLE 1

Synthesis of 8-ethyl-8-tricyclodecanol

A solution of 200 ml (1.0 mol) of ethyl magnesium bromide dissolved in diethyl ether was put into a 500 ml three-necked round-bottom flask, 30 g (0.2 mol) of tricyclodecan-8-one dissolved in diethyl ether was slowly dropped thereinto at room temperature using a dropping funnel, and was then reacted in a reflux condition for about 12 hours.

After the reaction was completed, the reactant was poured into excess water and neutralized using HCl. Thereafter, a crude product was extracted using diethyl ether and dried using $MgSO_4$. Then, the solvent was evaporated and a desired product was separated from the crude product using column chromatography (yield: 65%).

EXAMPLE 2

Synthesis of 8-ethyl-8-tricyclodecanyl acrylate 18 g (0.1 mol) of 8-ethyl-8-tricyclodecanol synthesized in Example 1 and 11 g (0.11 mol) of triethylamine were dissolved in 200 ml of anhydrous tetrahydrofuran (THF) and 10 g (0.11 mol) of acryloyl chloride was slowly added thereto at room temperature, and then the reactant was reacted for about 12 hours.

After the reaction was completed, excess solvent was evaporated, and the reactant was poured into excess water and neutralized using HCl. Thereafter, a crude product was extracted using diethyl ether and dried using $MgSO_4$. Then, the solvent was evaporated and a desired product was separated from the crude product using column chromatography (yield: 75%).

EXAMPLE 3

Synthesis of 8-ethyl-8-tricyclodecanyl methacrylate 18 g (0.1 mol) of 8-ethyl-8-tricyclodecanol synthesized in Example 1 and 11 g (0.11 mol) of triethylamine were dissolved in 200 ml of anhydrous THF and 0.11 mol of methacryloyl chloride was reacted in the same manner as in Example 2. Then, a desired product was separated in the same manner as in Example 2 (yield: 75%).

EXAMPLE 4

Synthesis of 8-methyl-8-tricyclodecanyl acrylate 8-ethyl-8-tricyclodecanol was synthesized in the same manner as in Example 1 using a methyl magnesium bromide solution, and then a desired product was separated using 8-ethyl-8-tricyclodecanol in the same manner as in Example 2.

EXAMPLE 5

Synthesis of 2-methyl-2-adamantyl acrylate 17 g (0.1 mol) of 2-methyl-2-adamantanol and 11 g (0.11 mol) of triethylamine were dissolved in 250 ml of anhydrous THF and 10 g (0.11 mol) of acryloyl chloride was slowly added thereto at room temperature, and then the reactant was reacted for about 12 hours.

After the reaction was completed, excess solvent was evaporated, and the reactant was poured into excess water and neutralized using HCl. Thereafter, a crude product was extracted using diethyl ether and dried using $MgSO_4$. Then, the solvent was evaporated and a desired product was separated from the crude product using column chromatography (yield: 75%).

EXAMPLE 6

Synthesis of 2-methyl-2-adamantyl methacrylate 17 g (0.1 mol) of 2-methyl-2-adamantanol and 11 g (0.11 mol) of triethylamine were dissolved in 250 ml of anhydrous THF and 0.11 mol of methacryloyl chloride was slowly added thereto at room temperature, and then the reactant was reacted for about 12 hours.

Thereafter, a desired product was separated in the same manner as in Example 5 (yield: 75%).

EXAMPLE 7

Synthesis of 2-methyl-2-isobornyl acrylate

A solution of 0.2 mol of camphor dissolved in diethyl ether was slowly dropped into 200 ml of a solution of 1.0 mol of methyllithium dissolved in diethyl ether at room temperature using a dropping funnel and reacted for about 2 hours, and then 20 g (0.22 mol) of acryloyl chloride was slowly added thereto at room temperature, and then the reactant was reacted in a reflux condition for about 12 hours.

After the reaction was completed, the reactant was poured into excess water and neutralized using $H_2SO_4$. Thereafter, a crude product was extracted using diethyl ether and dried using $MgSO_4$. Then, the solvent was evaporated and a desired product was separated from the crude product using vacuum distillation (yield: 65%).

EXAMPLE 8

Synthesis of 2-methyl-2-norbornyl acrylate

A solution of 0.2 mol of norcamphor dissolved in diethyl ether was slowly dropped into 200 ml of a solution of 1.0 mol of methyllithium dissolved in diethyl ether at room temperature using a dropping funnel and reacted for about 2 hours, and then 20 g (0.22 mol) of acryloyl chloride was slowly added thereto at room temperature, and then the reactant was reacted in a reflux condition for about 12 hours.

After the reaction was completed, a desired product was separated in the same manner as in Example 7 (yield: 65%).

EXAMPLE 9

Synthesis of copolymer

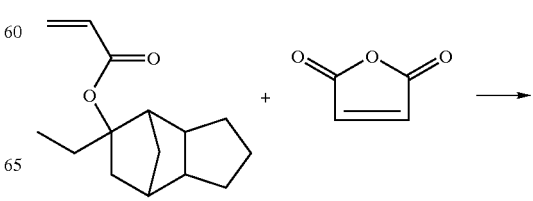

-continued

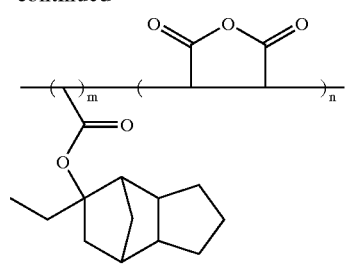

7.03 g (30 mmol) of 8-ethyl-8-tricyclodecanyl acrylate synthesized in Example 2, 5.88 g (60 mmol) of maleic anhydride and azobis(isobutyronitrile) (AlBN) (4 mol %) were dissolved in 13 g of anhydrous THF, and purged using nitrogen gas for about 1 hour. Thereafter, the reactant was polymerized at 700° C. for about 24 hours.

After the polymerization was completed, the reactant was slowly dropped into excess n-hexane to be precipitated, dissolved again in THF and reprecipitated twice in a co-solvent (n-hexane:isopropylalcohol=1:1). Then, the precipitate was dried in a vacuum oven maintained at 50° C. for about 24 hours to obtain a desired polymer (yield: 70%).

The weight-average molecular weight (Mw) and polydispersity of the obtained product were 8,900 and 1.8, respectively.

EXAMPLE 10

Synthesis of Copolymer 30 mmol of 8-ethyl-8-tricyclodecanyl methacrylate synthesized in Example 3, 60 mmol of maleic anhydride and AlBN (4 mol %) were dissolved in 15 g of anhydrous THF and polymerization was carried out in the same manner as in Example 9.

After polymerization was completed, a desired polymer was obtained in the same manner as in Example 9 (yield: 65%).

The weight-average molecular weight (Mw) and polydispersity of the obtained product were 7,300 and 1.9, respectively.

EXAMPLE 11

Synthesis of Copolymer 30 mmol of 8-methyl-8-tricyclodecanyl acrylate synthesized in Example 4, 60 mmol of maleic anhydride and AlBN (4 mol %) were dissolved in 15 g of anhydrous THF and polymerization was carried out in the same manner as in Example 9.

After polymerization was completed, a desired polymer was obtained in the same manner as in Example 9 (yield: 70%).

The weight-average molecular weight (Mw) and polydispersity of the obtained product were 8,300 and 1.8, respectively.

EXAMPLE 12

Synthesis of Copolymer

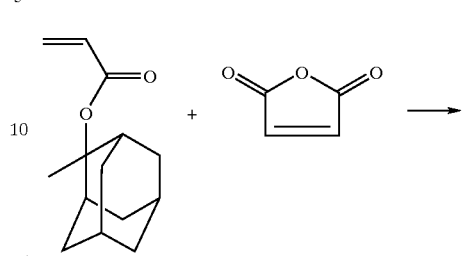

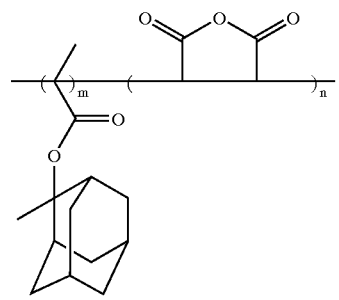

6.61 g (30 mmol) of 2-methyl-2-adamantyl acrylate synthesized in Example 5, 5.88 g (60 mmol) of maleic anhydride and AlBN (4 mol %) were dissolved in 12 g of anhydrous THF, and purged using nitrogen gas for about 1 hour. Thereafter, the reactant was polymerized at 70° C. for about 24 hours.

After the polymerization was completed, the reactant was slowly dropped into excess n-hexane to be precipitated, dissolved again in THF and reprecipitated twice in a co-solvent (n-hexane:isopropylalcohol=1:1). Then, the precipitate was dried in a vacuum oven maintained at 50° C. for about 24 hours to obtain a desired polymer (yield: 70%).

The weight-average molecular weight (Mw) and polydispersity of the obtained product were 9,100 and 1.8, respectively.

EXAMPLE 13

Synthesis of Copolymer 30 mmol of 2-methyl-2-isobornyl acrylate synthesized in Example 7, 60 mmol of maleic anhydride and AlBN (4 mol %) were dissolved in 13 g of anhydrous THF and then polymerization was carried out in the same manner as in Example 12, to obtain a polymer (yield: 70%).

The weight-average molecular weight (Mw) and polydispersity of the obtained product were 7,800 and 1.9, respectively.

EXAMPLE 14

Synthesis of Copolymer 30 mmol of 2-methyl-2-norbornyl acrylate synthesized in Example 8, 60 mmol of maleic anhydride and AlBN (4 mol %) were dissolved in 13 g of anhydrous THF and polymerization was carried out in the same manner as in Example 12, to obtain a polymer (yield: 70%).

The weight-average molecular weight (Mw) and polydispersity of the obtained product were 8,100 and 1.9, respectively.

EXAMPLE 15

Synthesis of Terpolymer 35 mmol of 8-ethyl-8-tricyclodecanyl methacrylate synthesized in Example 3, 50 mmol of maleic anhydride, 5 mmol of methacrylic acid and AIBN (4 mol %) were dissolved in 15 g of anhydrous THF, and polymerization was carried out in the same manner as in Example 12, to obtain a terpolymer represented by the following formula (yield: 70%).

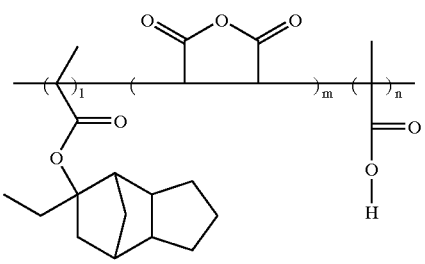

The weight-average molecular weight (Mw) and polydispersity of the obtained product were 7,400 and 1.9, respectively.

EXAMPLE 16

Patterning Process Using Resist Composition

Herein below, the following processes were used for preparing the resist compositions used in a patterning process.

A polymer selected from the polymers synthesized in Examples 9 through 15 (12 to 15% by weight of solid matter based on the total weight of a solvent to be obtained) and various types of photoacid generator (PAG) were dissolved in a solvent, and 0.01 to 2.0% by weight of an organic base made of amine (based on the total weight of the polymer) was added thereto to completely dissolve the reactants.

Examples of the PAG include inorganic onium salts (0.5 to 3.0% by weight based on the total weight of polymer) and organic sulfonates (1.0 to 10% by weight based on the total weight of polymer), or a mixture of at least two of theses materials.

Examples of the solvent include propylene glycol monomethyl ether acetate (PGMEA) and ethyl lactate (EL), or a mixture of at least two of these materials.

Thereafter, the solution was filtered using a 0.2 μm membrane filter to obtain a resist composition.

Then, for a patterning process using the resist composition obtained by the above method, the following processes were used.

A silicon wafer having a silicon oxide film formed thereon was prepared and treated with hexamethyldisilazane (HMDS). Then, the resist composition was coated on the silicon oxide film to a thickness of about 0.3 to 0.5 μm.

The wafer having the resist composition coated thereon was pre-baked at a temperature of 100 to 140° C. for 60 to 120 seconds and exposed to light using a light source such as DUV, E-beam or X-ray. Then, post exposure baking (PEB) was performed at a temperature of 100 to 150° C. for 60 to 120 seconds.

Thereafter, the resultant was developed using 2.38 wt % of tetramethylammonium hydroxide (TMAH) solution for about 10 to 90 seconds. As a result, the silicon oxide film was etched with a predetermined etching gas, for example, halogen gas or $C_xF_y$ gas, using the obtained resist pattern as a mask. Subsequently, the resist pattern remaining on the silicon wafer was removed using a stripper to form a desired silicon oxide pattern.

Next, detailed examples of forming patterns using the resist composition prepared in the same method as in Example 16 will be described.

EXAMPLE 16-1

A resist composition was prepared using 1.0 g of polymer synthesized in Example 9,15 mg of triphenylsulfonirum triflate (TPSOTf) as a PAG and 2 mg of triisobutylamine as an organic base were completely dissolved in 8.0 g of PGMEA and then filtered using a 0.2 μm membrane filter to obtain a resist composition. The obtained resist composition was coated on a wafer to a thickness of about 0.3 μm.

Thereafter, the wafer having the resist composition coated thereon was pre-baked at a temperature of 130° C. for 90 seconds and exposed to light using an ArF excimer laser having a numerical aperture (NA) of 0.6 and a of 0.7. Then, post exposure baking (PEB) was performed at a temperature of 130° C. for 90 seconds.

The resultant was developed using 2.38 wt % of TMAH solution for about 60 seconds to form a resist pattern.

When an exposure dose was about 15 $mJ/cm^2$, it was observed that a 0.20 μm line and space pattern was obtained.

EXAMPLE 16-2

A resist composition was prepared using 1.0 g of polymer synthesized in Example 9,10 mg of TPSOTf and 20 mg of N-succinimidyl triflate as PAGs and 4 mg of triisobutylamine as an organic base were completely dissolved in 8.0 g of PGMEA and then filtered using a 0.2 μm membrane filter to obtain a resist composition. The obtained resist composition was coated on a wafer to a thickness of about 0.3 μm.

Thereafter, a resist pattern was formed in the same manner as in Example 16-1.

When an exposure dose was about 20 $mJ/cm^2$, it was observed that a 0.20 μm line and space pattern was obtained.

EXAMPLE 16-3

A resist composition was prepared using 1.0 g of polymer synthesized in Example 12, 15 mg of TPSOTf as a PAG and 2 mg of triisobutylamine as an organic base were completely dissolved in 8.0 g of PGMEA and then filtered using a 0.2 μm membrane filter to obtain a resist composition. The obtained resist composition was coated on a wafer to a thickness of about 0.3 μm.

Thereafter, a resist pattern was formed in the same manner as in Example 16-1.

When an exposure dose was about 18 $mJ/cm^2$, it was observed that a 0.20 μm line and space pattern was obtained.

EXAMPLE 16-4

Poly(ethylene glycol) having a weight-average molecular weight of 2,000 as a surfactant was added to the resist compositions obtained in Examples 16-1 through 16-3 in an amount of about 200 ppm and then a resist pattern was prepared in the same manner as in Example 16-1.

When an exposure dose was about 15 to 20 mJ/cm², it was observed that a μm line and space pattern was obtained.

Photomechanism of Copolymer

The photomechanism of a copolymer forming the resist composition obtained in Example 16-1 is as follows.

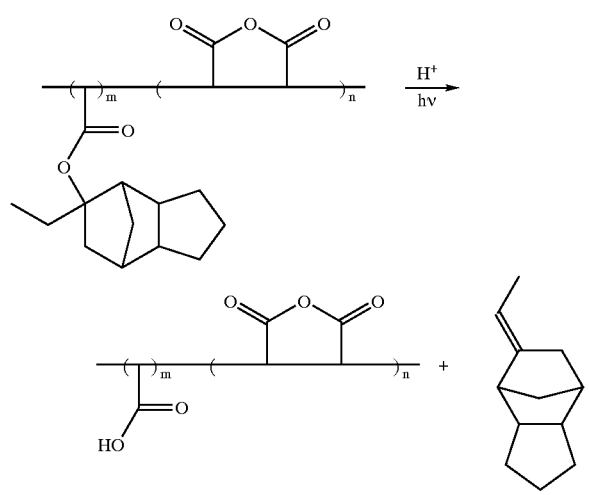

As shown in the above photomechanism, the resist composition according to the present invention exhibits a low solubility to a developing solution in an unexposed region by a bulky alicyclic protecting group having a dissolution inhibition effect acting on an alkaline developing solution, while exhibiting a high solubility in an exposed region by a decomposition of the bulky alicyclic protecting group in the presence of acid (H⁺). Thus, a resist composition having high contrast can be obtained, thereby achieving a high-resolution, high-sensitivity resist pattern.

Since the photosensitive polymer employs a maleic anhydride monomer, which is inexpensive, the manufacturing cost is substantially reduced, thus overcoming cost related problems encountered by the conventional (meth)acrylate polymers. Further, the resist composition obtained from the photosensitive polymer has improved adhesion to underlying layers and improved resistance to dry etching. Also, the transmittance is noticeably enhanced and the yield is increased.

Also, the photosensitive polymer according to the present invention has an appropriate glass transition temperature in the range of 140 to 180° C. Thus, a resist layer prepared using the photosensitive polymer according to the present invention exhibits a sufficiently high annealing effect during baking, thereby reducing the free volume thereof. Therefore, the stability against ambient atmosphere of the resist layer can be improved even with post-exposure delay (PED), thereby improving the lithographic performance. Thus, the resist composition according to the present invention can be useful in the manufacture of next generation semiconductor devices.

Although the present invention has been described in detail through preferred embodiments, the invention is not limited thereto, and various modifications and alterations within the spirit and scope of the invention are possible by those skilled in the art.

What is claimed is:

1. A photosensitive copolymer having a weight-average molecular weight of 3,000 to 100,000 and consisting essentially of first and second monomers represented by the following formulae:

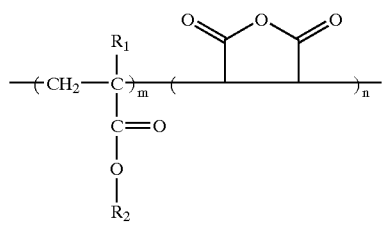

wherein $R_1$ is a hydrogen atom or methyl, $R_2$ is an acid-labile tertiary alkyl group, and m/(m+n) is 0.5 to 0.8, and wherein $R_2$ is 2-methyl-2-norbornyl, 2-ethyl-2-norbornyl, 2-methyl-2 isobornyl, 2-ethyl-2-isobornyl, 8-methyl-8-tricyclo[5.2.1.0²,⁶]decanyl, or 8-ethyl-8-tricyclo[5.2.1.0²,⁶]decanyl.

2. The photosensitive copolymer according to claim 1, wherein the photosensitive polymer has a weight-average molecular weight of 5,000 to 30,000.

3. The photosensitive copolymer according to claim 1, wherein $R_2$ is an alicyclic hydrocarbon group.

4. A resist composition comprising:
   (a) a photosensitive copolymer having a weight-average molecular weight of 3,000 to 100,000 and consisting essentially of first and second monomers represented by the following formulae:

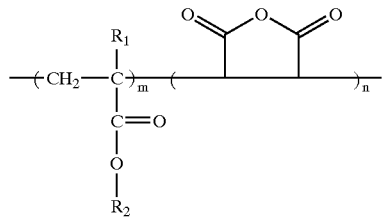

wherein $R_1$ is a hydrogen atom or methyl, $R_2$ is an acid-labile tertiary alkyl group, and m/(m+n) is 0.5 to 0.8, and wherein $R_2$ is 2-methyl-2-norbornyl, 2-ethyl-2-norbornyl, 2-methyl-2-isobornyl, 2-ethyl-2-isobornyl, 8-methyl-8-tricyclo[5.2.1.0²,⁶]decanyl, or 8-ethyl-8-tricyclo[5.2.1.0²,⁶]decanyl; and
   (b) a photoacid generator (PAG).

5. The resist composition according to claim 4, wherein the photosensitive polymer has a weight-average molecular weight of 5,000 to 30,000.

6. The resist composition according to claim 4, wherein the PAG is contained in an amount of 1.0 to 15% by weight based on the total weight of the copolymer.

7. The resist composition according to claim 6, wherein the PAG is selected from the group consisting of triarylsulfonium salts, diaryliodonium salts, sulfonates or mixtures thereof.

8. The resist composition according to claim 7, wherein the PAG is triphenylsulfonium triflate, diphenyliodonium triflate, triphenylsulfonium nonaflate, diphenyliodonium nonaflate, triphenylsulfonium antimonate, diphenyliodonium antimonate, di-t-butyl diphenyliodonium triflate, N-succinimidyl triflate, 2,6-dinitrobenzyl sulfonate, or a mixture thereof.

9. The resist composition according to claim 4, further comprising an organic base.

10. The resist composition according to claim 9, wherein the organic base is contained in an amount of 0.01 to 2.0% by weight based on the total weight of the copolymer.

11. The resist composition according to claim 10, wherein the organic base is triethylamine, triisobutylamine, trioctylamine, diethanolamine, triethanolamine or a mixture thereof.

12. The resist composition according to claim 4, further comprising a surfactant.

13. The resist composition according to claim 12, wherein the surfactant is contained in an amount of 50 to 500 ppm.

14. The resist composition according to claim 12, wherein the surfactant is polyether or polysulfonate.

15. The resist composition according to claim 14, wherein the surfactant is poly(ethylene glycol).

16. The resist composition according to claim 4, wherein $R_2$ is an alicyclic hydrocarbon group.

* * * * *